(12) United States Patent
Guo

(10) Patent No.: US 9,006,849 B2
(45) Date of Patent: Apr. 14, 2015

(54) HYBRID METHOD OF PATTERNING MTJ STACK

(71) Applicant: Yimin Guo, San Jose, CA (US)

(72) Inventor: Yimin Guo, San Jose, CA (US)

( * ) Notice: Subject to any disclaimer, the term of this patent is extended or adjusted under 35 U.S.C. 154(b) by 0 days.

(21) Appl. No.: 14/226,814

(22) Filed: Mar. 26, 2014

(65) Prior Publication Data

US 2014/0299951 A1 Oct. 9, 2014

Related U.S. Application Data

(60) Provisional application No. 61/809,392, filed on Apr. 7, 2013.

(51) Int. Cl.
| | |
|---|---|
| H01L 43/12 | (2006.01) |
| H01L 43/02 | (2006.01) |
| H01L 29/82 | (2006.01) |
| H01L 21/00 | (2006.01) |
| H01L 21/8246 | (2006.01) |
| H01L 21/02 | (2006.01) |
| H01L 43/08 | (2006.01) |

(52) U.S. Cl.
CPC .................. *H01L 43/12* (2013.01); *H01L 43/02* (2013.01); *H01L 43/08* (2013.01)

(58) Field of Classification Search
CPC ........ H01L 43/08; H01L 27/228; H01L 43/12; H01L 43/10; H01L 43/02
USPC .................................................. 257/416–426
See application file for complete search history.

(56) References Cited

U.S. PATENT DOCUMENTS

| | | | |
|---|---|---|---|
| 2010/0240151 A1* | 9/2010 | Belen et al. ................... | 438/3 |
| 2011/0081732 A1* | 4/2011 | Choi ............................... | 438/3 |
| 2014/0048893 A1* | 2/2014 | Wu et al. ..................... | 257/421 |
| 2014/0295579 A1* | 10/2014 | Guo ............................... | 438/3 |

* cited by examiner

*Primary Examiner* — Wael Fahmy
*Assistant Examiner* — Nelson Garces

(57) ABSTRACT

This invention comprises a method to make small MTJ element using hybrid etching and oxygen plasma immersion ion implantation. The method has no removal of the magnetic free layer (or memory layer) and hence prevents any possible physical damage near the free layer edges. After photolithography patterning, alternative Ta, Ru, Ta etchings are performed before it stops on an MgO intermediate layer above the free layer. Then an oxygen plasma immersion ion implantation is performed to completely oxidize the exposed portion of the free layer, leaving the hard mask covered portion unchanged which define the lateral width of the MTJ element.

21 Claims, 4 Drawing Sheets

HYBRID METHOD OF PATTERNING MTJ STACK

RELATED APPLICATIONS

This application claims the priority benefit of U.S. Provisional Application No. 61/809,392 filed on Apr. 7, 2013, which is incorporated herein by reference.

BACKGROUND OF THE INVENTION

1. Field of the Invention

This invention relates generally to spin-electronic devices, more particularly to a magnetic tunnel junction and methods for patterning the same.

2. Description of the Related Art

Magnetoresistive elements having magnetic tunnel junctions (also called MTJs) have been used as magnetic sensing elements for years. In recent years, magnetic random access memories (hereinafter referred to as MRAMs) using the magnetoresistive effect of MTJ have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer, and a fixed layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents.

Further, as in a so-called perpendicular MTJ element, both two magnetization films have easy axis of magnetization in a direction perpendicular to the film plane due to their strong magnetic crystalline anisotropy, shape anisotropies are not used, and accordingly, the device shape can be made smaller than that of an in-plane magnetization type. Also, variance in the easy axis of magnetization can be made smaller. Accordingly, by using a material having a large magnetic crystalline anisotropy, both miniaturization and lower currents can be expected to be achieved while a thermal disturbance resistance is maintained.

There has been a known technique for achieving a high MR ratio in a perpendicular magnetoresistive element by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved. However, where a MTJ is formed as a device of a perpendicular magnetization type, the materials of the recording layer typically used in an in-plane MTJ for both high MR and low damping constant as required by low write current application normally don't have enough magnetic crystalline anisotropy to achieve thermally stable perpendicular magnetization against its demagnetization field. In order to obtain perpendicular magnetization with enough thermal stability, the recording layer has to be ferromagnetic coupled to additional perpendicular magnetization layer, such as TbCoFe, or CoPt, or multilayer such as (Co/Pt)n, to obtain enough perpendicular anisotropy. Doing so, reduction in write current becomes difficult due to the fact that damping constant increases from the additional perpendicular magnetization layer and its associated seed layer for crystal matching and material diffusion during the heat treatment in the device manufacturing process.

In a spin-injection MRAM using a perpendicular magnetization film, a write current is proportional to the perpendicular anisotropy, the damping constant and inversely proportional to a spin polarization, and increases in proportional to a square of an area size. Therefore, reduction of the damping constant, increase of the spin polarization and reduction of an area size are mandatory technologies to reduce the write current.

Besides a write current, the stability of the magnetic orientation in a MRAM cell as another critical parameter has to be kept high enough for a good data retention, and is typically characterized by the so-called thermal factor which is proportional to the perpendicular anisotropy as well as the volume of the recording layer cell size. Although a high perpendicular anisotropy is preferred in term of a high thermal disturbance resistance, an increased write current is expected as a cost.

To record information or change resistance state, typically a recording current is provided by its CMOS transistor to flow in the stacked direction of the magnetoresistive element, which is hereinafter referred to as a "vertical spin-transfer method." Generally, constant-voltage recording is performed when recording is performed in a memory device accompanied by a resistance change. In a STT-MRAM, the majority of the applied voltage is acting on a thin oxide layer (tunnel barrier layer) which is about 10 angstroms thick, and, if an excessive voltage is applied, the tunnel barrier breaks down. More, even when the tunnel barrier does not immediately break down, if recording operations are repeated, the element may still become nonfunctional such that the resistance value changes (decreases) and information readout errors increase, making the element un-recordable. Furthermore, recording is not performed unless a sufficient voltage or sufficient spin current is applied. Accordingly, problems with insufficient recording arise before possible tunnel barrier breaks down.

In the mean time, since the switching current requirements reduce with decreasing MTJ element dimensions, STT-MRAM has the potential to scale nicely at even the most advanced technology nodes. However, patterning of small MTJ element leads to increasing variability in MTJ resistance and sustaining relatively high switching current or recording voltage variation in a STT-MRAM.

Reading STT MRAM involves applying a voltage to the MTJ stack to discover whether the MTJ element states at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ. Majorities of cell-to-cell variations come from the MTJ cell patterning process.

The MTJ patterning process becomes one of the most challenging aspects of manufacturing. Conventional techniques utilized to pattern small dimensions in a chip, such as ion milling etching (IBE) or reactive ion etching (RIE), having been less than satisfactory when applied to magnetic tunnel junction stacks used for MRAM. In most cases when these techniques are used, it is very difficult or almost impossible to cleanly remove etched materials without partial damages to magnetic tunnel junction properties and electric current shunting. In a RIE etching of magnetic material, physical sputtering is still the major component which unavoidable results in the formation of re-deposited residues that can short circuit the junctions of the MTJ or create shunting channel of the MTJ, yielding high resistance variations and serious reliability issues.

Although a partial free layer etch with subsequent oxygen oxidation of the top surface may solve the problem of electrical shorting from the tunneling barrier, it cannot avoid the physical damage of the free layer during etching, yielding a performance degradation of the recording layer and reference layer in the MTJ, due to magnetic material change caused by high energy particles from etching. Further, exposure to reactive gases during refilling deposition of dielectrics such as silicon dioxide or silicon nitride after the MTJ etching can also cause corrosion of sensitive magnetic materials.

Thus, it is desirable to provide a greatly improved method or innovative method that enables well-controllable and low cost fabrication in MTJ patterning while eliminating damage, degradation and corrosion.

BRIEF SUMMARY OF THE PRESENT INVENTION

The present invention comprises a method of patterning a magnetic tunnel junction of a magnetoresistive element for spin-electronic devices, such as MRAM, magnetic sensor and magnetic recording head. The magnetoresistive element in an MRAM is sandwiched between an upper electrode and a lower electrode, and a spin polarized current is bi-directionally supplied to the magnetoresistive element for data recording, and a select transistor is electrically connected between the magnetoresistive element and the write circuit.

According to methods to be described hereinafter, an MTJ stack is first formed on a substrate followed by sequential depositions of an MgO intermediate layer, a protective cap layer and a hard mask layer. A first area of the protective cap layer is masked while a second area of the protective cap layer is exposed first to an etching process with stopping at the top surface of the MgO intermediate layer, and further to oxygen plasma immersion ion implantation process. The exposed area, including the recording layer, is then converted to a highly resistive non-magnetic compound by forming of highly oxidized crystalline structure. As an option, a conventional photo-lithographic patterning process is utilized to make a larger footprint mask overlaid on the first area and further etch away the exposed area.

According to the invention, an MTJ stack is formed on a substrate, the MTJ consists of a recording layer, a reference layer and a MgO tunnel barrier layer disposed between the recording layer and the reference layer, an MgO intermediate layer provided on the MTJ stack, a protective cap layer provided on the intermediate layer, and there is provided a method of patterning a magnetic tunnel junction which comprises:

forming a hard mask having an opening area on the cap layer;
etching the protective cap layer with stopping at the top surface of the MgO intermediate layer;
conducting an oxygen plasma immersion ion implantation to the depth position to the MgO tunnel barrier layer from a surface of the intermediate layer exposed in the opening of the mask;
refilling a dielectric layer;
removing the photo-mask;
flattening the top surface by a CMP process;
conducting a deposition and patterning of a top electrode;
carrying out a thermal annealing with respect to the substrate to oxidize an ion implantation region and re-crystallized MgO layer so that a highly oxidized MgO layer having a greatly increased resistance is formed and an oxidized recording layer having a highly increased resistance and zero or near zero magnetization moment is formed in the mask opening area; and forming a dielectric region outside of the mask opening area on the substrate and a functional magnetoresistive element underneath the mask covering area on the substrate.

Various embodiments will be described hereinafter with reference to the companying drawings. The drawings are schematic or conceptual, and the relationships between the thickness and width of portions, the proportional coefficients of sizes among portions, etc., are not necessarily the same as the actual values thereof.

DETAILED DESCRIPTION OF THE INVENTION

In general, according to each embodiment, there is provided a magnetoresistive element, formed on a substrate, comprising:

a recording layer having magnetic anisotropy in a film surface and having a variable magnetization direction;
a reference layer having magnetic anisotropy in a film surface and having an invariable magnetization direction;
a tunnel barrier layer provided between the recording layer and the reference layer;
an MgO intermediate layer provided on a top surface of above MTJ stack;
a protective cap layer provided on top surface of above intermediate layer.

The following detailed descriptions are merely illustrative in nature and are not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

In general, the process disclosed here can be used to make any type of MRAM devices including field-driven, toggle, spin torque transfer magnetic random access memory with magnetization either in-plane or perpendicular to the plan. For illustration purpose, we describe a perpendicular spin torque transfer magnetic random access memory (pSTT-MRAM) and other types should be similar.

Figure 1:
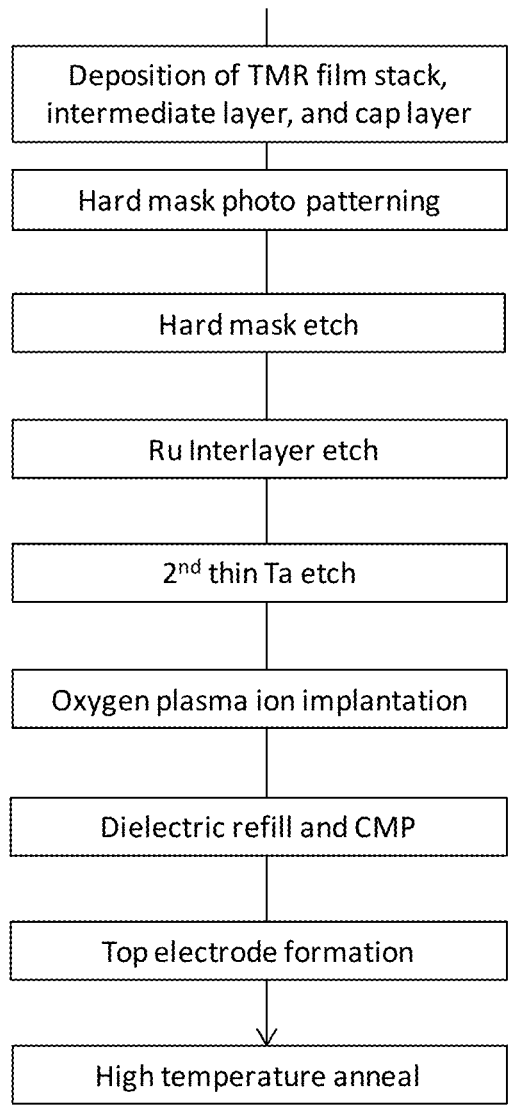
FIG. 1 Process flow chart of the invention
FIG. 2(A) MTJ film stack with free layer at top and reference layer at bottom
FIG. 2(B) MTJ film stack with free layer at bottom and reference layer at top
FIG. 3(A) After photolithography patterning, Ta hard mask is etched
FIG. 3(B) The Ru interlayer is etched
FIG. 3(C) 2nd thin Ta layer is etched
FIG. 3(D) Oxygen plasma immersion ion implantation is conducted.
Figure 2A:
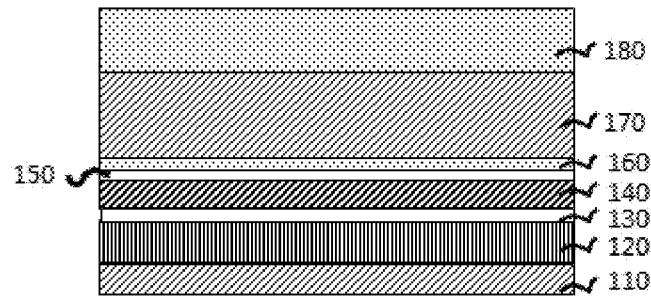
Figure 2B:
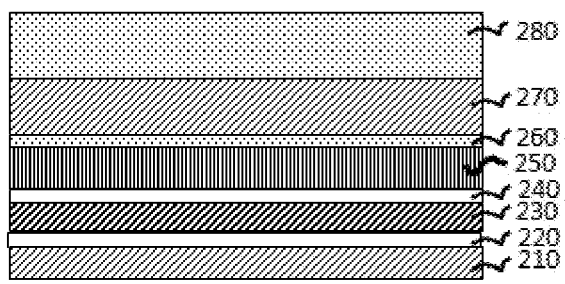

The process flow is as shown in FIG. 1. The MTJ film stack for pSTT-MRAM contains a seed layer (110), a magnetic reference layer (120), an MgO tunnel barrier layer (130), a recording or memory layer (140), an MgO intermediate layer (150), a thin Ta layer (160), a metallic interlayer (170), and a hard mask layer (180) as shown in FIG. 2(A). A reverse type will have a film stack shown in FIG. 2(B).

The seed layer (110) is typically Ta, Ru, or Ta/Ru, Ta/Ru/Ta with a thickness between 1-5 m. If the seed layer is used as a bottom electrode, then the film thickness should be increased accordingly, for example 10-50 nm. The magnetic reference layer (120) for pSTT-MRAM is typically CoPt, CoPd, CoTb, FePt, FePd, FeTb or Co/Pt, Co/Pd, Fe/Pt, FePd multilayer with a total thickness between 30 A to 80 A. For in-plane STT-MRAM, the reference layer can be an AP structure of AFM/CoFe/Ru/CoFe/. The MgO layer (130) can be formed by directly sputtering if MgO target or Mg with oxygen natural oxidation or plasma or radical oxidation. The memory layer (140) for pSTT-MRAM is typically CoFeB or CoFeB/CoFe bilayer with a thickness between 1-3 nm. For in-plane STT-MRAM, it can be CoFe/CoFeB, or CoFe/CoB or NiFe containing multilayer with a thickness between 2-8 nm. The second layer of MgO (150) should be thin (<1 nm) and containing less oxygen to allow for a better electrical conduction. The Ta layer (160) above the second MgO in general should be thin, but should be thick enough as a good etching stopper for the interlayer etching. The metallic interlayer (170) is Ru, or Cu, or other good conduction material. Its thickness should be thick enough (5-20 m) to prevent ion implantation punch through. The top hard mask layer (180) is Ta or W with a thickness between 10-30 nm.

Figure 3A:
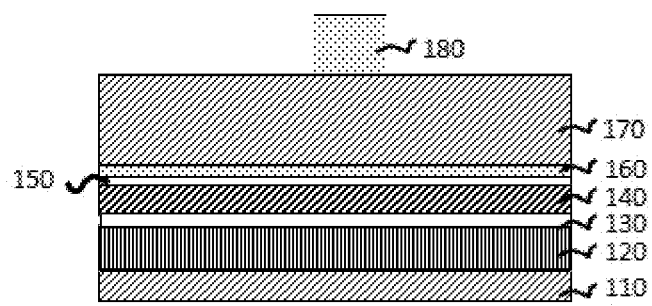
FIG. 3(E) Dielectric (SiO2) refill is used to fill the etched space
FIG. 3(F) CMP is used to remove the top oxide layer from Ru and flatten the surface.
FIG. 3(G) Top electrode is formed
Figure 3B:
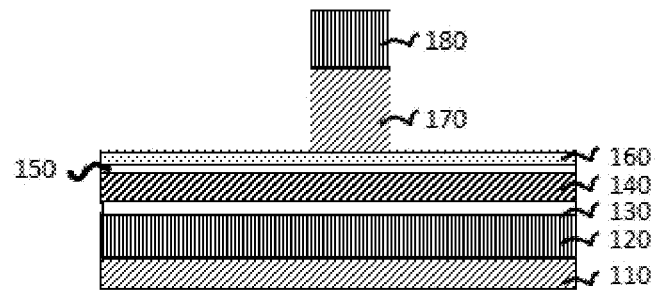
Figure 3C:
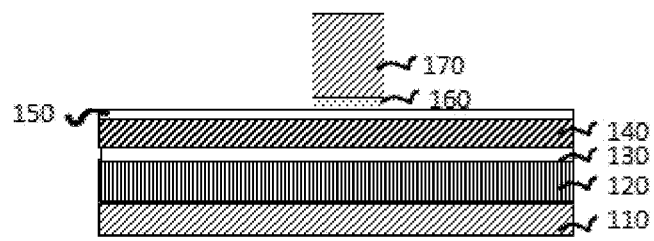

After the film deposition, a photolithography patterning is performed, which can either one patterning or dual pattern & etch. The patterned wafer is then etched to remove Ta by CF4 or CF3H or other C, F, H containing chemical etchants. The etching should be stopped on top of Ru interlayer (FIG. 3(A)). Then oxygen plasma is used to remove the remaining photoresist and etching re-dep. Then another etch is immediately carrier out to etch Ru layer using CH3OH, or CO & NH4. The etching should be stopped on the thin Ta layer (160) as shown in FIG. 3(B). Then, a third etch is performed to remove the thin Ta and top Ta hard mask using CF4 or CF3H or other C,F,H containing chemical etchants. The etching should be stopped on top of MgO (150), as shown in FIG. 3(C).

Figure 3D:
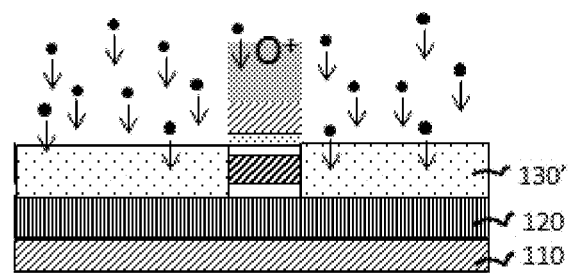

Then immediately an oxygen plasma ion implantation is conducted to add oxygen into the memory layer (140) beneath the top MgO to convert the exposed portion of the memory layer into non-magnetic AND electrically insulating matrix (130) to define a MRAM cell width in the top Ru mask protected area as shown in FIG. 3(D).

Figure 3E:
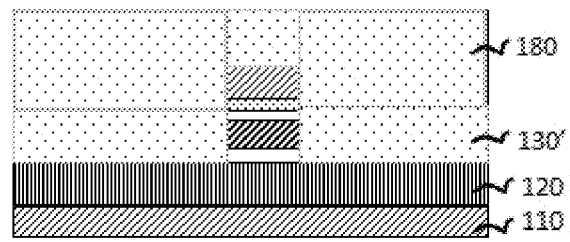
Figure 3F:
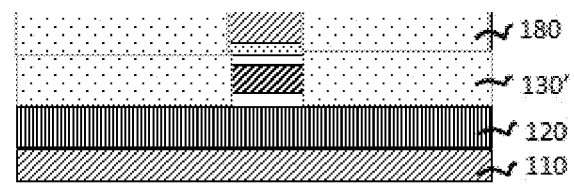
Figure 3G:
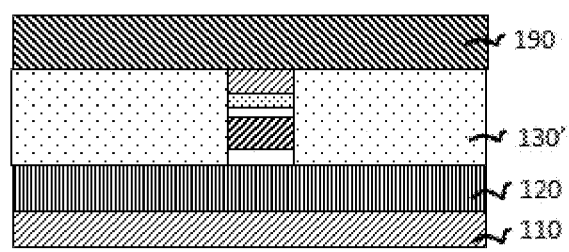

Then a dielectric SiO2 or SiNx or Al2O3 layer is refilled in the etched portion (180) as shown in FIG. 3(E) and after a hard mask lift-off, a CMP is conducted to flatten the wafer surface and remove the top portion of Ru interlayer which may be oxidized during oxygen plasma ion implantation, as shown in FIG. 3(F). After finishing the CMP process, a metallic multi-layer consisting of Ta/Ru/Ta or Ta/(Cu or Al alloy)/Ta is deposited on top of the CMP-flattened surface, followed by a photolithography patterning and etching to form top electrode, as shown in FIG. 3(G).

The wafer is finally annealed at high temperature between 250C to 500C for a time between 30 seconds to 30 minutes to activate the oxygen-metallic bonding and also to repair the damage during oxygen ion implantation.

In the MRAM manufactured by the patterning methods according to these embodiments, both tunnel barrier layer and intermediate barrier layer have been heavily added Mg and fully oxidized in exposed regions, leaving a desired shape for an MTJ element as a functional sensing or memory recording. Since the area resistivity in exposed region is readily altered to be 1000 to 10000 times as large as the area resistivity in still functional MTJ elements underneath masks, an applied electric current would essentially flow across the functional MTJ element. An optional conventional lithographic process can be conducted to pattern a much larger region covering above ion-implantation patterned MTJ element. Spin transfer switching characteristics of magnetoresistive elements used in memory cells can be improved due to less damage and side shunting. Further, the magnetoresistive elements are manufactured with a much improved uniformity in cell resistance, which benefits both reading and writing processes. Accordingly, MRAMs manufactured according to these embodiments would have high productivity.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A method of manufacturing a magnetic tunnel junction device comprising: an MTJ stack is formed on a substrate, the MTJ stack consists of a seed layer, a recording layer, a reference layer and a tunnel barrier layer disposed between the recording layer and the reference layer, an intermediate layer provided on a top surface of the MTJ stack, a protective cap layer provided on a top surface of the intermediate layer, a mask layer provided on a top surface of the cap layer and there is provided a method of patterning a magnetic tunnel junction which comprises:

conducting a photolithographic process to form a patterned mask having an opening exposed area on the cap layer;

etching the protective cap layer with stopping at the top surface of the intermediate layer;

conducting an oxygen plasma immersion ion implantation to the depth position to the tunnel barrier layer from a surface of the intermediate layer exposed in the opening of the mask;

refilling a dielectric layer;

flattening the top surface by a CMP process;

conducting a deposition and patterning of a top electrode;

carrying out a thermal annealing with respect to the substrate to oxidize the plasma immersion ion implantation region so that a highly oxidized layer having a greatly increased resistance is formed and an oxidized recording layer having a highly increased resistance and zero or near zero magnetization moment is formed in the mask opening area; and forming a dielectric region outside of the mask opening area on the substrate and a functional magnetoresistive element underneath the mask covering area on the substrate.

2. The element of claim 1, wherein said magnetic tunnel junction device is a spin torque transfer magnetic random access memory (STT-MRAM).

3. The element of claim 1, wherein said is a perpendicular spin torque transfer magnetic random access memory (pSTT-MRAM).

4. The element of claim 1, wherein said seed layer is Ta, Ru, or Ta/Ru with a thickness between 1 nm to 5 nm.

5. The element of claim 1, wherein said seed layer is a bottom electrode having a thickness ranged between 10 nm and 50 nm.

6. The element of claim 1, wherein said magnetic reference layer is CoPt, CoPd, CoTb, FePt, FePd, FeTb or Co/Pt, Co/Pd, Fe/Pt, FePd multilayer with a total thickness between 3 nm to 8 nm.

7. The element of claim 1, wherein said tunnel barrier is fully or partially oxidized MgO having a thickness 0.8-1.5 nm.

8. The element of claim 1, wherein said magnetic memory layer is CoFeB, or CoFeB/CoFe having a thickness between 1 nm and 3 nm.

9. The element of claim 1, wherein said intermediate layer is partially oxidized MgO having a thickness less than 1.5 nm.

10. The element of claim 1, wherein said cap layer is a multilayer consisting of a Ta sub-layer on the top surface of said intermediate layer and a metallic inter sub-layer on the top surface of the Ta sub-layer.

11. The element of claim 10, wherein said Ta sub-layer has a thickness between 0.5 and 2 nm.

12. The element of claim 10, wherein said metallic inter-layer sub-layer is a Ru, Cu, Mg, Cr having a thickness between 8 nm and 20 nm.

13. The element of claim 1, wherein said hard mask layer is Ta or W, having a thickness between 8 nm and 30 nm.

14. The element of claim 1, wherein said mask layer is etched and patterned by a RIE process using CF4, or CF3H or other C,F,H containing etchant gases, and the etching stops on top of the cap layer.

15. The element of claim 1, wherein said surface after mask patterning is treated by oxygen containing plasma to remove the remaining photo-resist and other etching re-dep.

16. The element of claim 1, wherein said surface is RIE-etched using a chemical gas CH3OH, or a mixed chemical gas of CO and NH4 and etching stops on the thin Ta sub-layer of said cap layer.

17. The element of claim 1, wherein further comprising a RIE etching using CF4, or CF3H or other C,F,H containing etchant gases, and the etching stops on top surface of said intermediate layer.

18. The element of claim 1, wherein said oxygen plasma ion implantation is conducted to fully oxidize the memory layer.

19. The element of claim 1, wherein said refilling material is selected from SiO2 or SiNx.

20. The element of claim 1, wherein said top electrode is deposited having Ta/Ru/Ta or Ta/(Cu or Al alloy)/Ta with a thickness between 10 nm-100 nm.

21. The element of claim 1, wherein said high temperature annealing is preferred to have an annealing temperature between 250C and 800C for 30 seconds to 30 minutes to activate the oxidation bonding and to repair the damage from oxygen ion implantation.

* * * * *